United States Patent [19]
De Los Santos

[11] Patent Number: 5,883,549
[45] Date of Patent: *Mar. 16, 1999

[54] BIPOLAR JUNCTION TRANSISTOR (BJT)—RESONANT TUNNELING DIODE (RTD) OSCILLATOR CIRCUIT AND METHOD

[75] Inventor: Hector J. De Los Santos, Inglewood, Calif.

[73] Assignee: Hughes Electronics Corporation, Los Angeles, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 879,456

[22] Filed: Jun. 20, 1997

[51] Int. Cl.$^6$ .................... H03B 7/00; H03B 7/06
[52] U.S. Cl. ............... 331/107 T; 331/115; 331/132
[58] Field of Search ..................... 331/107 T, 115, 331/132, 143, 111

[56] References Cited

U.S. PATENT DOCUMENTS

| | | | |
|---|---|---|---|
| 3,440,567 | 4/1969 | Goell | 331/107 T |
| 3,701,051 | 10/1972 | Simms | 331/107 T |

FOREIGN PATENT DOCUMENTS

| | | | |
|---|---|---|---|
| 0139915 | 1/1980 | Germany | 331/107 T |

OTHER PUBLICATIONS

*Solid State Radio Engineering*, John Wiley & Sons, 1980, Chapter 5, pp. 128–139.
*Physics of Quantum Electron Devices*, Springer–Verlag, Federico Capasso (Ed.), 1990, pp. 155–158.
*High–Speed Semiconductor Devices*, S.M. Sze (Ed.), John Wiley & Sons, 1990, pp. 467–475.
Fukuyama et al., "Current–voltage characteristics of GaAs/AlAs double–barrier resonant tunneling diodes with a Si–planar–doped barrier", *J. Applied Physics*, vol. 79, No. 3, 1 Feb. 1996, pp. 1801–1806.
Chang et al., "Analysis of Heterojunction Bipolar Transistor/Resonant Tunneling Diode Logic for Low–Power and High–Speed Digital Applications", *IEEE Transactions on Electron Devices*, vol. 40, No. 4, Apr. 1993, pp. 685–691.

*Primary Examiner*—Arnold Kinkead
*Attorney, Agent, or Firm*—Terje Gudmestad; Georgann S. Grunebach; Michael W. Sales

[57] ABSTRACT

A BJT, an inductor, and an RTD are configured to define a negative resistance oscillator circuit that is suitable for monolithic integration. The BJT is forward biased so that the RTD operates at a DC operating point $(I_Q, V_Q)$ on its characteristic I–V curve in its negative differential resistance region. The thermal noise inherent in the circuit causes it to start oscillating about the DC operating point $(I_Q, V_Q)$ where the RTD's negative resistance $R_n$ provides positive feedback that amplifies the oscillations until equilibrium is established thereby producing a sinusoidal waveform. The low power BJT/RTD oscillator operates at power levels approximately one-tenth those of known integrated feedback oscillators and oscillates at frequencies in the hundreds of Ghz range that are currently only achievable using waveguide oscillators.

14 Claims, 2 Drawing Sheets

BIPOLAR JUNCTION TRANSISTOR (BJT)—RESONANT TUNNELING DIODE (RTD) OSCILLATOR CIRCUIT AND METHOD

BACKGROUND OF THE INVENTION

1. Field of the Invention

This invention relates to oscillator circuits and more specifically to a low power BJT-RTD oscillator.

2. Description of the Related Art

Communications systems use sinewave oscillators to establish transmitter carrier frequencies, drive mixer stages that convert signals from one frequency to another, and generate clocking signals. Of particular interest are wireless communications systems such as satellites or portable systems where low-power consumption and high frequency performance are important. Most known oscillators include a single active device such as a diode, BJT, or FET and a tuned circuit (or crystal) in a positive feedback path. The feedback loop is self limiting so that the oscillations do not become unbounded but instead reach an equilibrium at which a stable sinusoidal waveform is produced.

*Solid State Radio Engineering*, John Wiley & Sons, Ch. 5, pp. 128–139, 1980 describes two different types of sinewave oscillators; negative resistance and feedback oscillators. In a negative resistance oscillator, a parallel-resonant RLC circuit is connected across a negative resistance device such as an active diode. The static resistance of this device is always positive and, hence the diode always absorbs direct current. However, above a peak voltage the diode's small-signal resistance is negative. Therefore, biasing the circuit at an operating point Q above the peak voltage provides positive feedback that causes the circuit to oscillate. As long as the diode delivers more power than the load absorbs, the amplitude of the oscillations will continue to grow. On each cycle, the diode will swing further away from the operating point Q where the magnitude of the small-signal resistance becomes quite large. This reduces the power delivered by the diode until equilibrium is established.

*Physics of Quantum Electron Devices*, Springer-Verlag, Federico Capasso (Ed.), pp.155–158, 1990 describes a negative resistance oscillator for use at frequencies in the hundreds of Ghz range. A waveguide is used to define the parallel-resonant RLC cavity. A resonant tunneling diode (RTD) chip is mounted on a stud that is connected to ground and connected via a "whisker" to another stud on the other side of the waveguide that is connected to a DC supply voltage. The RTD chip is biased to operate in its negative resistance region, which causes the cavity to oscillate and produce a sinusoidal waveform that travels down the waveguide to a load. A mechanical plunger is used to change the cavity dimensions and set the frequency of oscillation.

RTD chips are currently fabricated with III–V compounds such as indium phosphide (InP) or InAs/AlSb/GaSb and exhibit switching speeds in the terahertz range with peak voltages as low as 0.1V. As a result the negative-resistance waveguide oscillator uses very little power to produce a pure high frequency signal. However, because the waveguide cannot be monolithically integrated with the RTD chip, the oscillator is relatively large, expensive, difficult to mass produce and has poor reliability.

Feedback oscillators generally employ a gain element (junction transistor, FET or operational amplifier), a load (RLC circuit), and a feedback network. The output of the gain element must be fed back to its input with gain greater than unity and with a phase shift of 0° or some multiple of 360°. The circuit will oscillate at the frequency that produces this phase shift. Known feedback oscillators are monolithically integrated in silicon and gallium-arsenide technologies that support Ghz frequencies but require a minimum 2V supply to bias the active device. As a result, they consume a relatively large amount of power, which reduces battery life.

SUMMARY OF THE INVENTION

In view of the above problems, the present invention provides a low power oscillator circuit suitable for monolithic integration.

This is accomplished using a BJT and a RTD configured with an inductor in a negative resistance oscillator topology. The BJT is forward biased so that the RTD operates at a DC operating point $(I_Q, V_Q)$ in its negative differential resistance region. The thermal noise inherent in the circuit causes it to start oscillating about the DC operating point $(I_Q, V_Q)$ where the RTD's negative resistance $R_n$ averaged over each cycle provides positive feedback that amplifies the oscillations until equilibrium is established thereby producing a sinusoidal waveform at an output terminal.

These and other features and advantages of the invention will be apparent to those skilled in the art from the following detailed description of preferred embodiments, taken together with the accompanying drawings, in which:

DETAILED DESCRIPTION OF THE INVENTION

The present invention describes a low power BJT/RTD oscillator circuit topology that is suitable for monolithic integration. The RTD, BJT and an inductor are configured to define a relaxation type oscillator, in which the BJT is forward biased so that the RTD operates at an operating point in its negative differential resistance region. The RTD's negative differential resistance and BJT's gain together provide the positive feedback that causes the circuit to oscillate and produce a sinusoidal waveform.

Figure 1A:
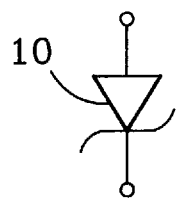
FIGS. 1*a* and 1*b* are respectively a schematic diagram of a RTD and a plot of its characteristic I–V curve.
Figure 1B:
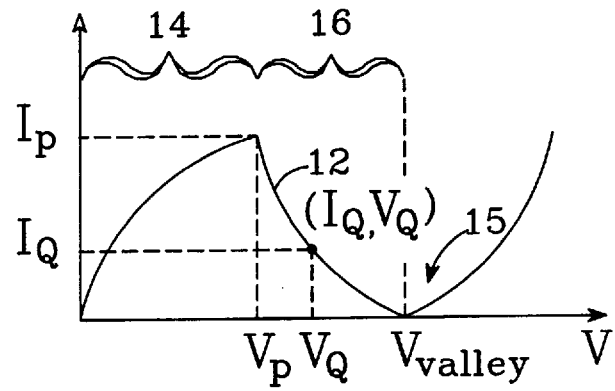

FIGS. 1*a* and 1*b* respectively show an RTD 10 and a typical characteristic I–V curve 12. *High-Speed Semiconductor Devices*, S. M. Sze (Ed.), John Wiley & Sons, pp. 467–475, 1990 describes the structure and I–V response of known double-barrier RTDs. The basic RTD includes five layers of different band gap materials suitably III–V compounds such as indium phosphide or antimonide. The outermost emitter and collector layers and center layer are suitably formed with the same low band gap material. The second and fourth layers are typically formed from the same high band gap material to provide the double-barrier structure. A positive bias voltage is applied across the emitter and collector layers to forward bias the device so that electrons tunnel through the two energy barriers.

At low bias voltages, the RTD responds like a typical resistive element. This is called the RTD's positive differential resistance region 14. At some point, commonly referred to as the peak voltage $V_P$, the energy of the incoming electrons is aligned with the energy of the first resonance of the quantum well between the barriers. This maximizes the probability of incoming electrons traversing both barrier walls, and thus maximizes the RTD's current.

At bias voltages above $V_P$, the energy of the incoming electrons becomes progressively more misaligned with the quantum well's resonant energy. As a result, even though the voltage across the RTD is increasing, its current level is reduced thereby producing a negative differential resistance $r_n$. This effect is observed up to a valley 15 at a voltage $V_{valley}$ beyond which other effects such as thermionic emission transport dominate. The region between $V_P$ and $V_{valley}$ is called the RTD's negative differential resistance region 16. The linearity of the RTD in its positive and negative differential resistance regions is controlled by design parameters depending upon the requirements of a particular application.

In the known and current oscillator circuits, the RTD is biased at a DC operating point $(I_Q,V_Q)$ in its negative differential resistance region to provide the positive gain necessary to sustain oscillations. To minimize power consumption, the RTD is designed to provide a low peak voltage $V_P$, as low as 0.1V, and hence a low operating voltage $V_Q$. Fukuyama et al. "Current-voltage characteristics of GaAs/AlAs double-barrier resonant tunneling diodes with a Si-planar-doped barrier," J. Applied Physics 79 (3), 1 Feb. 1996, pp. 1801–1806 disclose one approach, a planar-doped barrier, for reducing the RTD's peak voltage. Another approach is to change the material used in the center layer to lower its band gap. This type of structure is known as an antimonide based resonant interband tunneling structure. Lastly, another small well can be formed between the two barrier walls by replacing the single center layer with two layers on opposite sides of a lower band gap center layer.

Figure 2:
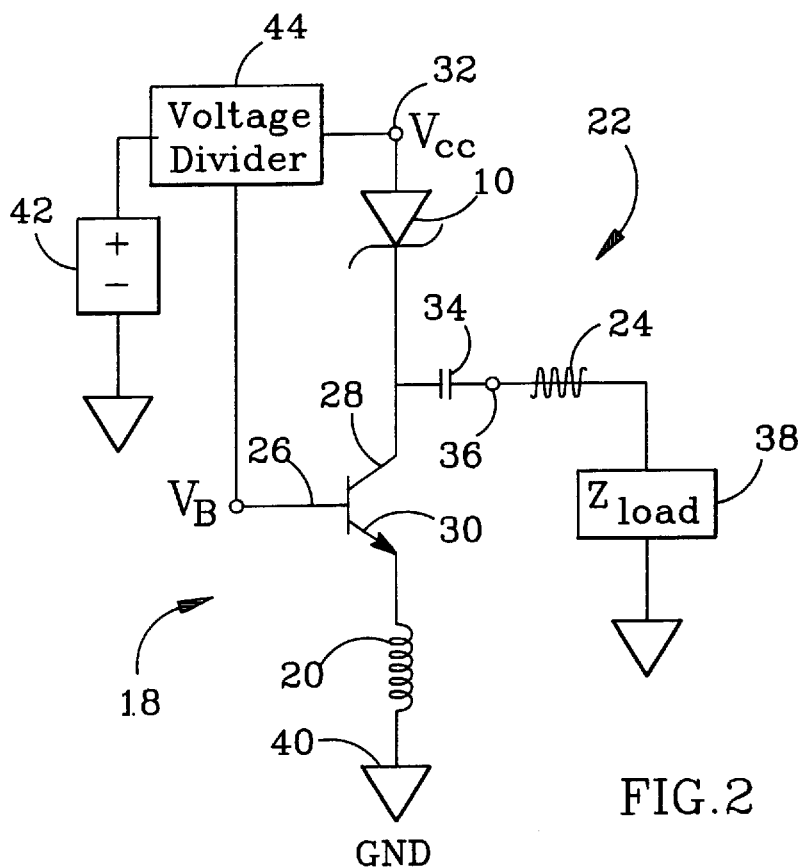
FIG. 2 is a schematic diagram of a preferred embodiment of a BJT/RTD oscillator circuit in accordance with the present invention.

As shown in FIG. 2, the present invention includes the RTD 10, a BJT 18 and an inductor 20 configured to define a relaxation type oscillator 22. The BJT 18 is forward biased so that the RTD 10 operates at an operating point $(I_Q,V_Q)$ in its negative differential resistance region 16 shown in FIG. 1b. The RTD's negative differential resistance and BJT's gain together provide the positive feedback that causes the circuit to oscillate and produce a sinusoidal waveform 24. The oscillator 22 can be implemented using either an npn or a pnp BJT, a single or double sided supply, and different topologies for connecting the BJT, RTD, and the inductor.

The preferred topology shown in FIG. 2 utilizes an npn BJT for speed and a single sided supply $V_{CC}$ for simplicity. The npn BJT 18 has a base 26, a collector 28, and an emitter 30. The RTD 10 is connected between the single-sided supply $V_{CC}$ at a supply terminal 32 and the collector 28 of the BJT. A DC blocking capacitor 34 is coupled between the BJT's collector 28 and an output terminal 36, which in turn is connected to a load 38. The inductor 20 is connected between the BJT's emitter 30 and a ground terminal 40 held at ground reference potential.

To make the circuit oscillate, a DC operating point $(I_Q,V_Q)$ is selected in the RTD's negative differential resistance region 16 shown in FIG. 1b at which the total resistance seen at the output terminal 36 including the RTD's negative differential resistance $r_n$, the load resistance $R_L$, and the resistance $R_0$ seen looking into the collector of the BJT is negative. To bias oscillator 22 at the selected operating point $(I_Q,V_Q)$, a bias voltage $V_B$ is applied to the base 26 of BJT 18 to forward bias the BJT so that its average collector current $I_C$ is equal to the current $I_Q$ at the operating point. The blocking capacitor 34 blocks any DC current from being driven into the load 38 and thus maintains this condition. The supply voltage $V_{CC}$ is then set so that the average voltage across RTD 10 is equal to the voltage $V_Q$ at the operating point. In the satellite and portable communications systems, a battery 42 supplies a constant voltage that a voltage divider 44 (fixed or programmable) shifts down to provide the supply voltage $V_{CC}$ and the bias voltage $V_B$.

The described bias conditions guarantee that the circuit will exhibit positive feedback with greater than unity gain at the operating point, which ensures that the thermal noise inherent in all resistors will trigger oscillation. As the circuit oscillates, the RTD's operating point will swing on either side of $(I_Q,V_Q)$ causing the instantaneous differential resistance $r_n$ to change and even become positive over part of each cycle when the amplitude of oscillation becomes sufficiently large. If the power delivered by the RTD is greater than the power absorbed by the load, the amplitude of the oscillations will increase. On each cycle this will drive the RTD farther into the regions near the peak and the valley shown in FIG. 1b where the magnitude of the differential resistance $r_n$ becomes very large. This increases the RTD's negative resistance $R_n$, which is its differential resistance $r_n$ averaged over each cycle, and decreases the power delivered until equilibrium is established.

Applicant's BJT/RTD oscillator circuit consumes much less power, as much as 90% less, than known feedback oscillators. The single-sided supply $V_{CC}$ can be much lower, for example 1.3V because it must only supply the voltage drops across the RTD (0.1V), the BJT's forward biased collector-emitter, and the inductor 20. This not only extends the life of the battery, but also allows a smaller battery, suitably 1.5V, to be used.

Unlike the known negative resistance waveguide oscillators, Applicant's BJT/RTD oscillator circuit is suitable for monolithic integration, using either the III–V compound technology currently used for RTDs or the silicon or gallium-arsenide technology used for BJTs. Although the BJT/RTD oscillator consumes slightly more power than the waveguide oscillator and has a lower quality factor, the size, cost, reliability, and reproducibility advantages associated with monolithic integration more than offset these disadvantages. Alternately, the RTD and BJT can be fabricated in discrete chips, which is still cheaper, more reliable, and easier to mass produce than the waveguide oscillator.

Figure 3:
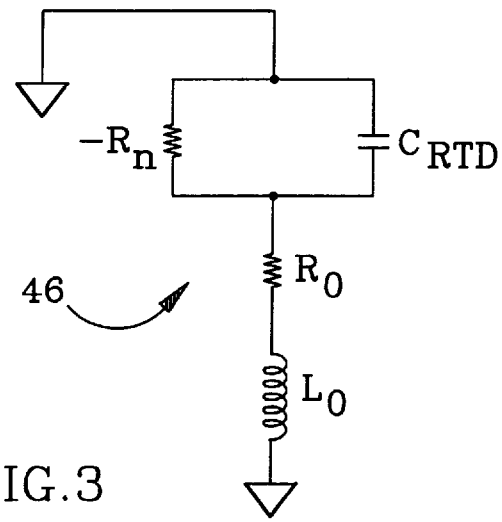
FIG. 3 is a model of the BJT/RTD oscillator circuit.

FIG. 3 illustrates a circuit model 46 of the BJT/RTD oscillator 22 shown in FIG. 2. The RTD is modeled by a negative resistance $R_n$ connected in parallel with a capacitance $C_{RTD}$. Typical values for the negative resistance are in the negative tens of ohms with capacitance values less than 10 pf. The impedance seen looking into the collector of the BJT is modeled by a resistance $R_0$ connected in series with an inductance $L_0$. $R_0$ and $L_0$ are functions of the BJT's small-signal transconductance $g_m$, input resistance $r_\pi$, output resistance $r_0$, collector node parasitic capacitance $C_{cp}$, the emitter inductor L and frequency.

The oscillation frequency $f_{Osc}$ of the sinusoidal waveform, neglecting the blocking capacitor, is approximated by:

$$f_{Osc} = \frac{1}{\sqrt{1 + g_m r_0}} \cdot \sqrt{\frac{1 - \frac{(1 + g_m r_0) \cdot L}{R_n^2 \cdot (C_{RTD} + C_{cp})}}{L(C_{RTD} + C_{cp}) - \frac{L^2}{r_\pi^2 (1 + g_m r_0)}}}$$

The maximum oscillation frequency is limited by the switching speed, i.e. maximum oscillation frequency, of the BJT. Current silicon technologies will support oscillation frequencies up to approximately 2 Ghz. The III–V compound technologies support RTD frequencies in the terahertz rang and BJT speeds in the one hundred Ghz range.

Depending upon the application, the oscillation frequency may be fixed or variable. The values of $C_{RTD}$, $R_0$, and $L_0$ are insensitive to small changes in biasing conditions, and therefore are considered fixed. However, the operating point of the RTD is sensitive to changes in biasing conditions. If the application calls for a fixed oscillation frequency, the RTD may be designed to exhibit a fairly linear response around the operating point so that $f_{Osc}$ is insensitive to small changes in biasing conditions.

If the RTD's I–V curve is non-linear around the operating point, the value of $R_n$ and hence the oscillation frequency will change with bias conditions. This property can be used to intentionally vary the oscillation frequency over a frequency range defined by the fixed RLC values and the range of $R_n$. The bias current $I_Q$ and, hence, the oscillation frequency can be set by changing the base drive $V_B$ applied to the BJT or by placing a FET in series with the RTD, which functions as a variable resistor.

Figure 4:
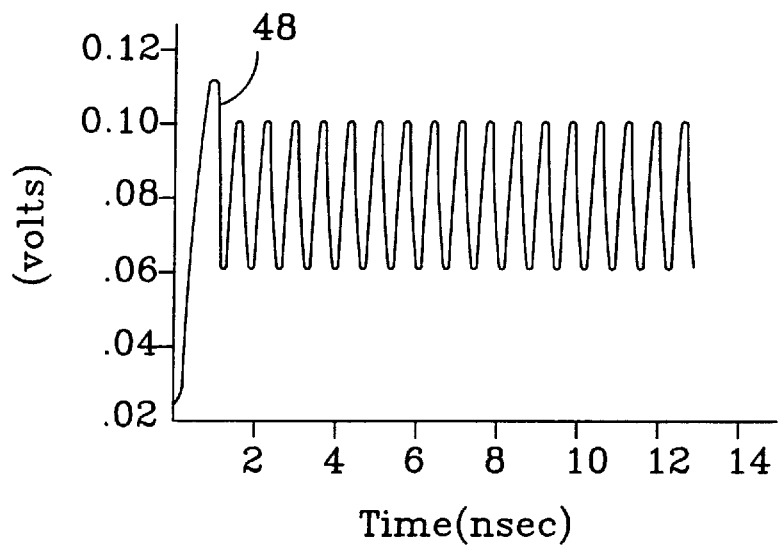
FIG. 4 is a plot of a typical sinusoidal voltage waveform generated by the BJT/RTD oscillator circuit.

FIG. 4 is a plot 48 of a 2 Ghz sinusoidal voltage waveform produced by the BJT/RTD oscillator 22 shown in FIG. 2. A bias voltage $V_B$=0.7V was applied to the base of the BJT to produce a bias current $I_Q$=1.8 mA. A single-sided supply voltage $V_{CC}$=1.3V tapped off a 1.5V battery provides the bias voltage $V_Q$=1.2V across the RTD.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An oscillator circuit comprising a bipolar junction transistor (BJT), an inductor, and a resonant tunneling diode (RTD) that are configured to define a relaxation type oscillator with the RTD connected to the BJT's collector and the oscillator circuit producing an output at the junction of the RTD and BJT, said RTD having a characteristic I–V curve that has positive and negative differential resistance regions, said BJT being forward biased so that said RTD operates at a DC operating point $(I_Q, V_Q)$ in its negative differential resistance region and produces a negative resistance seen looking into said BJT from said output, the thermal noise inherent in said oscillator circuit causing it to start oscillating about the DC operating point $(I_Q, V_Q)$ where the RTD's negative differential resistance provides positive feedback that amplifies the oscillations until equilibrium is established thereby producing a sinusoidal waveform at an oscillation frequency that is a function of said inductor.

2. The oscillator circuit of claim 1, wherein the maximum frequency of the sinusoidal waveform is limited by the switching speed of the BJT.

3. The oscillator circuit of claim 1, wherein said RTD's I–V curve is non-linear in its negative differential resistance region so that different DC operating points $(I_Q, V_Q)$ have different negative differential resistances that change the frequency of the sinusoidal waveform, said oscillator circuit being biased to set the current $I_Q$ and thus set the frequency of the sinusoidal waveform.

4. The oscillator circuit of claim 1, further comprising a low voltage battery and a voltage divider for forward biasing the BJT and biasing the RTD at its operating point.

5. An oscillator circuit comprising:

a ground terminal;

a supply terminal;

an output terminal;

an npn bipolar junction transistor (BJT) having a base, a collector connected to said output terminal, and an emitter;

an inductor that is connected between said ground terminal and said BJT's emitter; and a resonant tunneling diode (RTD) that is connected between said supply terminal and said BJT's collector, said RTD having a characteristic I–V curve that has positive and negative differential resistance regions that respectively lie at voltage levels below and above a peak voltage level $V_P$, supply and bias voltages respectively applied at said supply terminal and the base of said BJT biasing said RTD at a DC operating point $(I_Q, V_Q)$ on its characteristic I–V curve in its negative differential resistance region and forward biasing said BJT so that its average collector current is approximately equal to the current $I_Q$ at the DC operating point, said RTD producing a negative resistance seen looking into said BJT from said output terminal, the thermal noise inherent in said BJT causing said oscillator circuit to start oscillating about the DC operating point $(I_Q, V_Q)$ where the RTD's negative differential resistance provides positive feedback that amplifies the oscillations until equilibrium is established, thereby producing a sinusoidal waveform at an oscillation frequency that is a function of said inductor at said output terminal.

6. The oscillator circuit of claim 5, further comprising a low voltage battery and a voltage divider for providing the supply and bias voltages.

7. The oscillator circuit of claim 6, wherein said battery supplies an approximately 1.5V voltage.

8. The oscillator circuit of claim 5, wherein the frequency $(f_{Osc})$ of the sinusoidal waveform is equal to:

$$f_{Osc} = \frac{1}{\sqrt{1 + g_m r_0}} \cdot \sqrt{\frac{1 - \frac{(1 + g_m r_0) \cdot L}{R_n^2 \cdot (C_{RTD} + C_{cp})}}{L(C_{RTD} + C_{cp}) - \frac{L^2}{r_\pi^2 (1 + g_m r_0)}}}$$

where $R_n$ and $C_{RTD}$ are the RTD's parallel connected negative differential resistance averaged over one cycle the RTD parameters, $g_m$, $r_\pi$, $r_0$ and $C_{cp}$ are respectively the BJT's small-signal transconductance, input resistance, output resistance, and collector node parasitic capacitance, and L is the emitter inductor.

9. The oscillator circuit of claim 8, wherein the maximum frequency of the sinusoidal voltage waveform is limited by the switching speed of the BJT.

10. The oscillator circuit of claim 8, wherein said RTD's I–V curve is non-linear in its negative differential resistance region so that different DC operating points $(I_Q, V_Q)$ have different negative differential resistances that change the frequency of the sinusoidal waveform, said oscillator circuit being biased to set the current $I_Q$ and thus set the waveform's frequency within a range defined by the fixed values of $C_{RTD}$, $g_m$, $r_\pi$, $r_0$, and L and the range of values for $R_n$.

11. A method of providing an oscillating waveform, comprising:

providing a bipolar junction transistor (BJT), an inductor, and a resonant tunneling diode (RTD) that are configured to define a negative resistance oscillator circuit with the RTD connected to the BJT's collector and the oscillator circuit producing an output at the junction of the RTD and BJT, said RTD having a characteristic I–V curve that has positive and negative differential resistance regions; and forward biasing said BJT so that said RTD operates at a DC operating point $(I_Q,V_Q)$ on its characteristic I–V curve in its negative differential resistance region and produces a negative resistance seen looking into said BJT from said output, the thermal noise inherent in said oscillator circuit causing it to start oscillating about the DC operating point $(I_Q,V_Q)$ where the RTD's negative differential resistance provides positive feedback that amplifies the oscillations until equilibrium is established, thereby producing a sinusoidal waveform at an oscillation frequency that is a function of said inductor.

12. The method of claim 11, wherein said RTD's I–V curve is non-linear in its negative differential resistance region so that different DC operating points $(I_Q,V_Q)$ have different negative differential resistances that change the frequency of the sinusoidal waveform, further comprising:

varying the current $I_Q$ flowing through said RTD to vary the negative differential resistance and thus set the waveform's frequency within a range defined by a fixed capacitance $C_{RTD}$, the BJT's transconductance $g_m$, input resistance $r_\pi$, output resistance $r_0$, and the inductance L seen at the output terminal and the range of values for the negative differential resistance averaged over a cycle.

13. A method of providing an oscillating waveform, comprising:

providing an oscillator circuit, comprising:
a ground terminal;
a supply terminal;
an output terminal;
an npn bipolar junction transistor (BJT) having a base, a collector connected to said output terminal, and an emitter;
an inductor that is connected between said ground terminal and said BJT's emitter; and
a resonant tunneling diode (RTD) that is connected between said supply terminal and said BJT's collector, said RTD having a characteristic I–V curve that has positive and negative differential resistance regions that respectively lie at voltage levels below and above a peak voltage level $V_P$;

selecting a DC operating point $(I_Q,V_Q)$ in the RTD's negative differential resistance region;

applying a bias voltage to the base of the BJT to forward bias the BJT so that its average collector current is approximately equal to the current $I_Q$ flowing through the RTD at the selected DC operating point, said RTD producing a negative resistance seen looking into said BJT from said output terminal; and applying a supply voltage to the supply terminal that sets the DC voltage across the RTD equal to the voltage $V_Q$ at the selected DC operating point, the thermal noise inherent in said BJT causing said oscillator circuit to start oscillating about the DC operating point $(I_Q,V_Q)$ where the RTD's negative differential resistance provides positive feedback that amplifies the oscillations until equilibrium is established, thereby producing a sinusoidal voltage waveform at an oscillation frequency that is a function of said inductor at said output terminal.

14. The method of claim 13, wherein said RTD's I–V curve is non-linear in its negative differential resistance region so that different DC operating points $(I_Q,V_Q)$ have different negative differential resistances that change the frequency of the sinusoidal waveform, further comprising:

varying the DC operating point $(I_Q,V_Q)$ to vary the negative differential resistance and thus set the waveform's frequency within a range defined by the fixed values of the RTD's capacitance $C_{RTD}$, and the BJT's transconductance $g_m$, input resistance $r_\pi$, output resistance $r_0$, and the inductance L seen at the output terminal and the range of values for the negative differential resistance averaged over a cycle.

* * * * *